United States Patent
Hughes et al.

(10) Patent No.: US 6,654,594 B1
(45) Date of Patent: Nov. 25, 2003

(54) DIGITIZED AUTOMATIC GAIN CONTROL SYSTEM AND METHODS FOR A CONTROLLED GAIN RECEIVER

(75) Inventors: James David Hughes, Boynton Beach, FL (US); John Richard Oakley, Austin, TX (US); Clinton C Powell, II, Lake Worth, FL (US)

(73) Assignee: Motorola, Inc., Schaumburg, IL (US)

( * ) Notice: Subject to any disclaimer, the term of this patent is extended or adjusted under 35 U.S.C. 154(b) by 545 days.

(21) Appl. No.: 09/580,770

(22) Filed: May 30, 2000

(51) Int. Cl.[7] .............................. H04B 1/06; H04B 7/00
(52) U.S. Cl. ................. 455/245.1; 455/232.1; 455/234.1; 455/234.2; 455/240.1; 375/345
(58) Field of Search ............................ 455/232.1, 234.1, 455/234.2, 240.1, 242.2, 245.1; 375/345, 316–317

(56) References Cited

U.S. PATENT DOCUMENTS

| | | | | |
|---|---|---|---|---|
| 4,191,995 A | * | 3/1980 | Farrow | 700/37 |
| 4,471,317 A | | 9/1984 | Nilsson et al. | |
| 4,653,117 A | | 3/1987 | Heck | 455/209 |
| 4,757,502 A | | 7/1988 | Meuriche et al. | |
| 5,079,526 A | | 1/1992 | Heck | 332/127 |
| 5,483,691 A | | 1/1996 | Heck et al. | 455/234.2 |
| 5,563,916 A | * | 10/1996 | Scarpa | 375/345 |
| 5,584,059 A | | 12/1996 | Turney et al. | 455/126 |
| 5,617,473 A | | 4/1997 | Wietecha et al. | 379/399 |
| 5,630,221 A | * | 5/1997 | Birleson | 455/249.1 |
| 5,659,582 A | | 8/1997 | Kojima et al. | |
| 5,677,962 A | * | 10/1997 | Harrison et al. | 381/109 |
| 5,722,061 A | | 2/1998 | Hutchison, IV et al. | |
| 5,727,031 A | | 3/1998 | Solve et al. | |
| 5,789,974 A | | 8/1998 | Ferguson, Jr. et al. | 330/2 |
| 5,861,831 A | | 1/1999 | Murden et al. | |
| 5,893,029 A | | 4/1999 | Bastani | 455/324 |
| 5,917,865 A | | 6/1999 | Kopmeiners et al. | |
| 5,970,092 A | | 10/1999 | Currivan | |
| 6,005,506 A | | 12/1999 | Bazarjani et al. | |
| 6,006,077 A | | 12/1999 | Shull | |
| 6,052,566 A | | 4/2000 | Abramsky et al. | |
| 6,553,084 B1 | * | 4/2003 | Maru | 375/345 |
| 6,563,891 B1 | * | 5/2003 | Eriksson et al. | 375/345 |

* cited by examiner

Primary Examiner—Lee Nguyen
Assistant Examiner—Tuan Tran
(74) Attorney, Agent, or Firm—Randi L. Dulaney; Sylvia Chen

(57) ABSTRACT

An automatic gain control (AGC) system (100) for a controlled gain receiver (1101) includes a magnitude generator (160) and a gain corrector (170). The magnitude generator (160) generates a binary voltage squared signal (165) having a binary value that is directly proportional to a recovered signal power of an intercepted signal (113). The gain corrector (170) determines an adjustment of a gain control value (195) as a multiple of increments that are approximately 3 decibel (dB), by shifting (475, 445) a reference threshold by one or more bits and comparing (485, 455) the shifted reference threshold to the binary voltage squared signal. An initial setting of a state of a step attenuator (114) during a track mode (172) is determined during a warm up mode (171) by comparing the binary voltage squared signal (165) to two different thresholds (245, 255).

20 Claims, 9 Drawing Sheets

| STORAGE LOCATION | GAIN | VALUE ADJUSTMENT |
|---|---|---|
| 0 | MAX GAIN | $0_7 - 0_0$ |
| 1 | $-3$dB | $X_{1,1} X_{1,0}$ |
| 2 | $-6$dB | $X_{2,1} X_{2,0}$ |
| 3 | $-9$dB | $X_{3,1} X_{3,0}$ |
| 4 | $-12$dB | $X_{4,1} X_{4,0}$ |
| 5 ← POINTER | $-15$dB | $X_{5,1} X_{5,0}$ |
| 6 | $-18$dB | $X_{6,1} X_{6,0}$ |
| 7 | $-21$dB | $X_{7,1} X_{7,0}$ |
| 8 | $-24$dB | $X_{8,1} X_{8,0}$ |
| 9 | $-27$dB | $X_{9,1} X_{9,0}$ |
| 10 | $-30$dB | $X_{10,1} X_{10,0}$ |
| ⋮ | ⋮ | |
| 19 | $-57$dB | $X_{19,1} X_{19,0}$ |

*FIG. 3*

DIGITIZED AUTOMATIC GAIN CONTROL SYSTEM AND METHODS FOR A CONTROLLED GAIN RECEIVER

RELATED APPLICATION

This application is related to application Ser. No. 09/583,639 "Method and Apparatus for Determining a Stored Gain Response for a Controlled Gain Receiver", and to application Ser. No. 09/583,645 "Squaring Circuit and Electronic Device Using Same", both filed on the same date as this application, and both having Hughes et al. as inventors.

FIELD OF THE INVENTION

The present invention is directed to radio automatic gain control circuits (AGC), and more particularly to digital AGC circuits.

BACKGROUND OF THE INVENTION

Many conventional narrow band zero intermediate frequency (ZIF) receivers have slow AGC loop settling times, such as on the order of 6 to 10 milliseconds (msec.), and dynamic ranges that are too narrow, e. g., 85 decibels (dB). These characteristics lead to less than desirable performance in the fading conditions found in mobile and portable radio communication systems, such as paging, personal communication systems, and cellular communication systems. Furthermore, inexact gain control by prior art AGC's increases the difficulty of reducing DC offset, which reduces signaling performance. What is needed is a low cost, low power AGC that is fast, has a dynamic range in excess of 110 dB and provides more exact gain control.

BRIEF DESCRIPTION OF THE DRAWINGS

FIG. 3 is a map of a set of registers that hold a stored gain response used in the AGC system, in accordance with the preferred embodiment of the present invention.

DETAILED DESCRIPTION

Figure 1:
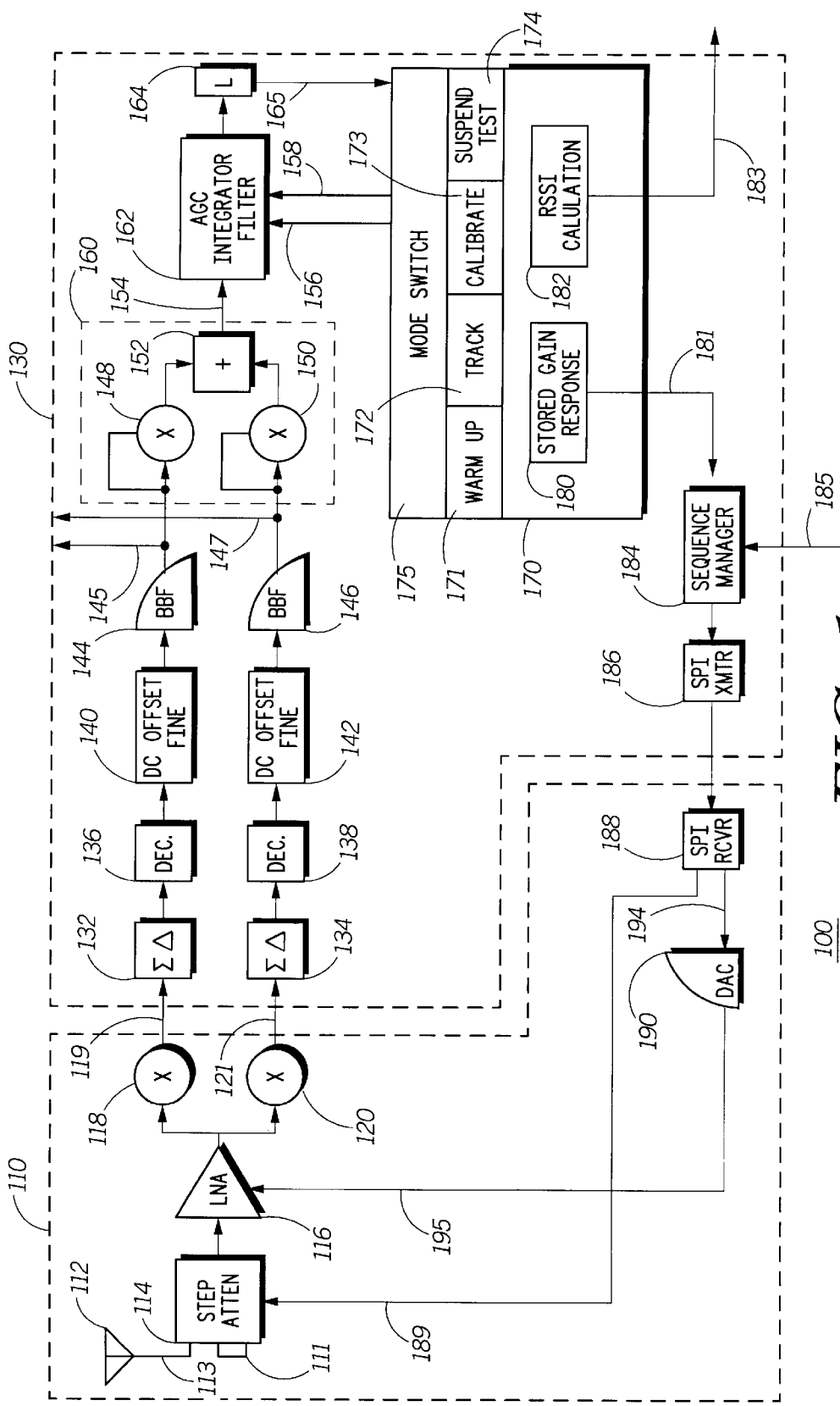
FIG. 1 is an electrical block diagram that shows an automatic gain control (AGC) system portion of a ZIF receiver, in accordance with a preferred embodiment of the present invention.

Although the specification concludes with claims defining the features of the invention that are regarded as novel, it is believed that the invention will be better understood from a consideration of the following detailed description in conjunction with the drawing figures, in which like reference numerals are carried forward.

AGC System Description

Figure 11:
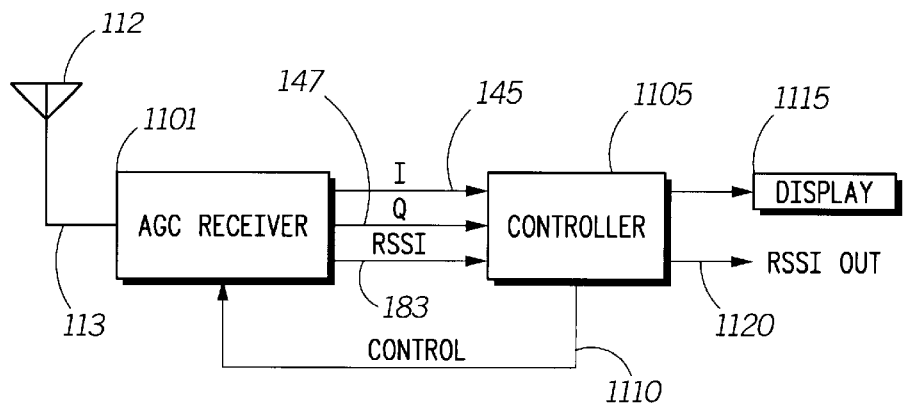
FIG. 11 is an electrical block diagram showing a radio that includes the AGC system, in accordance with the preferred embodiment of the present invention.

Referring to FIG. 1, an electrical block diagram shows an automatic gain control (AGC) system 100 portion of a ZIF receiver, in accordance with a preferred embodiment of the present invention. The AGC system 100 is a portion of an AGC receiver 1101 (see FIG. 11) of a radio 1100 (FIG. 11), and comprises a radio frequency (RF) front end 110 that intercepts an RF signal using antenna 112. The AGC receiver 1101, which is a zero IF receiver in the preferred embodiment of the present invention, attenuates the intercepted signal 113 in a step attenuator 114 according to an attenuator control signal 189, amplifies the RF signal in a low noise amplifier (LNA) 116, and converts the amplified RF signal within two mixers 118, 120 to an unfiltered in-phase (I) signal 119 and a quadrature phase (Q) unfiltered signal 121. The LNA 116 is controlled by a gain control signal 195, that is conveyed to the LNA 116 as an analog signal. The embodiments of the present invention described and claimed herein are optimized for a radio used in a communication system having a synchronous signaling protocol that has well defined signaling cycles consisting of a normal data portion preceded by a preamble portion, such as used in paging and cellular radio systems. The preamble portion has a predetermined duration that comprises synchronizing patterns such as included in the symbol, word, frame start, and bit rate patterns, but aspects of the present invention are also applicable for ZIF radio receivers and conversion type receivers (for example, single and dual conversion receivers) used in other types of communication systems having similar well defined cycles. The example of such a synchronous communication system used herein is the well known FLEX™ signaling protocol, in which the cycles are called frames. The unfiltered I and Q signals 119, 121 are coupled to a back end 130 of the AGC receiver 1101 (FIG. 11). The back end 130 samples the unfiltered I and Q signals 119, 121 by a pair of sigma-delta converters 132, 134. The sampled I and Q signals are then decimated and filtered by a pair of decimation functions 136, 138. The decimated I and Q signals are DC offset corrected in DC offset fine control functions 140, 142, and filtered by base band filters (BBFs) 144, 146. The filtered I signal 145 and filtered Q signal 147 generated by the DC offset fine control functions 140, 142 are coupled to other portions of the back end 130 and coupled to a controller function 1105 of the radio 1100 (see FIG. 11), wherein the information in the radio signal is decoded and processed, in a conventional manner, and a symbol clock 185 that is synchronized to symbols of the protocol (also called protocol symbols) conveying the information.

The filtered I and Q signals 145, 147 generated by the BBFs 144, 146 are also coupled to inputs of two squaring functions 148, 150 of a magnitude generator 160 that also comprises an adder function 152 that adds together the outputs of squaring functions 148, 150. An output signal 154 of the adder function 152, which is also the output signal 154 of magnitude generator 160, and is named a binary voltage squared signal, is coupled to an AGC filter 162. The output of the AGC filter 162 is buffered in latch (L) 164. The latch 164 holds the binary voltage squared signal, which has been filtered and delayed, and couples the binary voltage squared signal 165 to a gain corrector 170. The AGC filter is controlled by two signals, a bandwidth signal 156 and a symbol rate signal 158 generated by the gain corrector 170. It will be appreciated that the outputs of the magnitude generator 160, the AGC filter 162, and latch 164 are binary values that represent scaled units of voltage squared, and therefore they are scaled values that represent a recovered signal strength, or recovered signal power, of the intercepted signal 113. Furthermore, they are based on the power of the RF signal 113 that has been intercepted by the antenna 112, either attenuated or passed through the step attenuator 114 according to the attenuator control signal 189, modified by (attenuated, passed through, or amplified) the LNA 116 according to the gain control signal 195, and modified by a fixed gain (or loss) of the back end functional chain comprising the sigma-delta converters 132, 134, the decimation functions 136, 138, the DC offset fine control functions 140, 142, and the base band filters 144, 146, thereby resulting in the recovered signal 154, 165.

The low noise amplifier 116 is designed using conventional techniques to have a gain versus gain control value curve that is approximately logarithmic over a wide range, as will be discussed below with reference to FIG. 13. However, in order to keep the cost of producing the LNA 116 low, it is only somewhat logarithmic over the wide range, and hence is properly described as a non-logarithmic amplifier.

The gain corrector 170 comprises a mode switch 175 that has four modes: warm up 171, track 172, calibrate 173, and suspend test 174. The gain corrector 170 generates two outputs: a combined signal 181 and a received signal strength indicator (RSSI) signal 183. The combined signal 181 is coupled to a serial port interface (SPI) transmitter 186 through a sequence manager 184. The SPI transmitter 186 couples the combined signal 181 to SPI receiver 188, which couples a gain control value 194 conveyed in the combined signal 181 as a binary "word" of information to a digital to analog converter (DAC) input of the LNA 116, and couples an attenuator control signal 189 conveyed in the combined signal 181 as a binary state to step attenuator 114. The gain control value 194 is preferably 7 bits wide so that the combined signal 181 can be conveyed in a byte, but it will be appreciated that the gain control value 194 "word" can have other binary widths. The gain corrector 170 also comprises a stored gain response 180, from which the gain control value 194 is generated, and an RSSI function 182 that generates the RSSI signal 183. The gain corrector 170 generates the gain control value 194 such that the gain of the LNA 116 changes in an essentially accurate logarithmic manner with reference to changes in value of the gain control value 194.

In accordance with the preferred embodiment of the present invention, the sampling functions (described above), the sigma-delta converters 132, 134, the decimation functions 136, 138, the DC offset fine control functions 140, 142, and the base band filters 144, 146 are implemented as digital functions in a conventional processor, such as a digital signal processor (DSP), but it will be appreciated that these functions could be alternatively performed by analog circuits or digital logic implemented as a portion of a custom integrated circuit (IC) state machine. The magnitude generator 160 is implemented as digital logic implemented as a portion of a state machine IC, but could be alternatively performed by a processor, such as a DSP. The squaring functions 148, 150 are preferably implemented in a unique manner as described below, but could alternatively be performed by any technique that provides a square of a measured voltage value to a predetermined level of precision, such as by a memory table implemented as a portion of an IC state machine, or by conventional multiplication performed in a processor. The adder function 152, the AGC filter 162 and the latch 164 are conventional functions that are preferably implemented using digital logic that is a portion of the custom IC state machine, but could alternatively be implemented using a conventional processor or using a digital signal processor (DSP) using unique sets of program instructions stored in read only memory (ROM). The gain corrector 170, which incorporates several of the unique functions described herein, is also preferably implemented using digital logic that is a portion of the custom IC state machine, but it will be appreciated the functions could alternatively be implemented using a conventional processor or using a DSP using unique sets of program instructions stored in ROM. The modes of the mode switch 175, the stored gain response 180, and the RSSI function 182 are unique functions described in more detail below.

The sequernce manager 184 is a unique function that couples new gain control value words through the SPI transmitter and receiver 186, 188 and the DAC 190 to the LNA 116 only during the occurrences of edges of the protocol symbols that pass through the LNA 116. The sequence manager 184 compensates for fixed and varying delays in the AGC loop 100, so that new a gain control signal 195 is coupled to the LNA 116 at a next protocol symbol edge occurring within the LNA 116, within a small fraction of a symbol duration. The timing of the edges of the protocol symbols is inherently different at different stages of the front and back ends 110, 130 of the AGC receiver 1101 due to delays inherent in the stages of the AGC receiver 1101, and the timing of the edges changes with changes in the bandwidth of the AGC system 100 (also-called herein the "loop bandwidth", or the "AGC bandwidth") and with changes in the duration of the symbols. The SPI transfer occurs very quickly with reference to the duration of the symbol clock periods. This unique aspect of coupling the gain control values to the LNA 116 only at the protocol symbol edges within the LNA 116 helps to reduce digital switching noise in the AGC receiver 1101 front end during the center of the symbol period. Also, to help reduce digital noise, when a symbol clock edge occurs and the gain corrector 170 senses that the gain of the LNA 116 is still in the correct position (i.e., the RF signal has not changed significantly, and the gain control value 194 does not need to be updated), a gain control value 194 is not coupled over the SPI transmitter and receiver 186, 188 to the LNA 116 via the gain control signal 195 at the symbol clock edge.

The AGC system 100 described herein regulates the gain of the front end 110 to protect the radio 1100 from an overload condition. The AGC system 100 facilitates the successful operation of the radio 1100 over 115 dB of dynamic range. The AGC system 100 is also key in helping the AGC receiver 1101 to achieve excellent intermodulation and adjacent channel specifications. The RSSI signal 183 allows the host processor to poll and check a measure of channel strength for conventional purposes such as handoff decisions and transmit power adjustments, and to achieve precise tuning of the AGC receiver 1101.

The gain corrector 170 uses the voltage squared value that represents the recovered signal power, for all calculations involving the recovered signal power, and by doing so, is able to work in +/−3 dB increments by simply right or left shifting the value (and inserting zeroes in the least significant bit position when shifting left), since such shifting either halves or doubles the value representing the power level, which is very close to +/−3 dB changes.

This technique of manipulating input power values in +/−3 dB increments with binary shifts is key to simplifying the calculations in the AGC system 100, as opposed to prior art approaches which use fixed point multiplies and divides, and greatly reduces the circuitry (and or memory requirements) and the power used by the AGC system 100.

The AGC system 100 is a negative feedback circuit, and thus it can suffer from loop dynamics such as instability, overshoot, and undershoot. To minimize this, once the gain corrector 170 updates the LNA 116 with a changed gain control signal 195 (by updating the gain control value 194) and/or an attenuator control signal 189 change, gain corrector 170 waits for approximately two symbol periods at 6400 baud (two symbol periods have a duration of 625 microseconds (usec.)) before calculating a new gain control value 194. During this wait state, the AGC filter 162 is cleared and kept reset. This reset state, or delay, allows any perturbation of the signal caused by the last AGC update to propagate through the system. In the preferred embodiment of the present invention, the propagation delay from the LNA 116 to the latch 164 is approximately 450 usec. The reset state ensures that the next new measurement cycle for the gain corrector 170 will be based on clean data and the AGC system 100 remains stable. Because the propagation delay is essentially independent of the symbol rate, the reset state is. kept at approximately 625 usec for symbol rates other than 6400 baud. This reset state allows the AGC bandwidth to be faster than prior art AGC systems. (Typically, it can easily operate at a 400 Hz bandwidth which is twice as fast as prior art products). This is valuable because, traditionally, AGC bandwidths of a ZIF receiver are low due to inherent injected transients such as LNA gain induced DC offsets. Former AGC designs do not typically clear the loop filter. They allow the transients to be integrated by the loop and therefore take even longer to clear disturbances from the AGC system. The AGC wait delay can be modified to fit other systemic propagation delays.

In accordance with the preferred embodiment of the present invention, the RF:step attenuator 114 is digitally controlled by the gain corrector 170, and has two states: an attenuation state in which it provides approximately 17 dB of attenuation and a pass-through, or non-attenuation, state in which the signal is neither attenuated or amplified significantly. A decision whether to use the attenuation state of the step attenuator 114 is made near the beginning of a frame of the FLEX protocol. The radio 1100 starts the warm up mode 171 with the step attenuator 114 in the attenuation state. A determination is made by the gain correction function 170 during the warm up mode 171 whether to switch to the non-attenuated state. After the radio 1100 changes to the track mode 172, which occurs during normal data receive operations, the step attenuator 114 is switched to the non-attenuated state only when the recovered signal power drops below a predetermined AGC Step-Out Threshold. Following such a switch to the non-attenuated state, the step attenuator 114 is not switched back to the attenuated state during the same frame. This feature stops the step attenuator 114 from being switched from the non-attenuated to the attenuated state, and back, during a frame. This improves the performance of the radio 1100 because the step attenuator 114 can cause large perturbations on top of the wanted signal when it is switched, and repeated switching could lead to desensitization of the AGC receiver 1101. In most cases, the variable gain of the LNA 116 can be set low enough to handle reasonably large signals when the step attenuator 114 is switched to the non-attenuation state. The step attenuator 114 is most useful when the AGC receiver 1101 is in very strong intermodulation (IM) or adjacent channel signaling environments, which will typically last for at least a majority of a frame.

The present invention has three threshold values: AGC Tracking threshold (AGC−THRES), AGC Step Out threshold (AGC−THRESSO, and AGC Warm Up threshold (AGC THRESWU). The units of each threshold are volts squared.

The AGC Tracking threshold is set 16 dB to 20 dB above a signaling sense floor. The AGC Tracking threshold is the recovered signal power to which the AGC system 100 regulates during the track mode by controlling the gain of the LNA 116 by means of the gain control value 194, when the recovered signal power is greater than the AGC Tracking threshold. When the recovered signal power is less than the AGC Tracking threshold, the gain corrector 170 keeps the LNA 116 at a maximum gain.

The AGC Step Out threshold is preferably set 12 dB above the signaling sense floor. When the step attenuator 114 is in the attenuated state and the LNA 116 is at the maximum gain, the AGC Step Out threshold is used to determine whether to switch the step attenuator 114 to the non-attenuated state.

The AGC Warm Up threshold is preferably set 45 dB above the signaling sense floor. This threshold is used during the warm up mode to meet IM specifications, as described in more detail below.

The AGC system 100 uses a default hysteresis of +/−dB above and below each of the three thresholds. This hysteresis can be increased to +/−6 dB by appropriate programming.

Warm Up Mode

Figure 2:
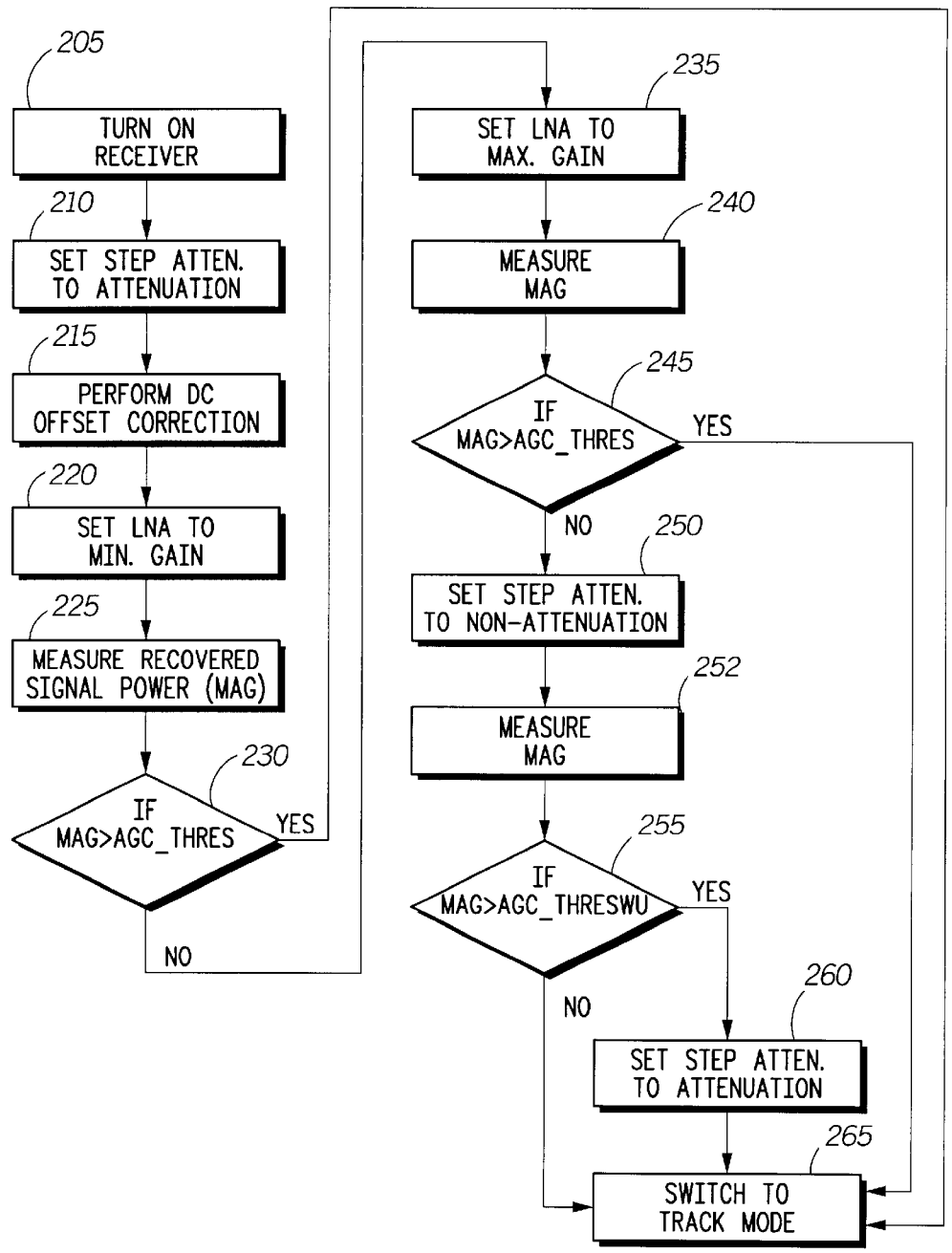
FIG. 2 is a flow chart that shows a warm up mode operation of the AGC system, in accordance with the preferred embodiment of the present invention.

Referring now to FIG. 2, a flow chart of the warm up mode 171 operation of the gain corrector 170 is shown, in accordance with the preferred embodiment of the present invention. The warm up mode 171 is used when the radio 1100 (FIG. 11) is operating synchronously with the synchronous signaling protocol, to make a decision as to whether to use step attenuator 114 in the attenuate mode during the track mode 172. (An asynchronous warm up mode, not described herein, is used when the radio 1100 is first turned on). The warm up mode 171 is normally timed to begin near the beginning of the preamble of a FLEX frame, after the radio 1100 has been operating in a communication system long enough to have established synchronism with the frame periods. At step 205, the radio 1100 turns on the AGC receiver 1101 to begin receiving a frame of information. It will be appreciated that in FLEX communication systems and other systems that are similar to it, when the radio 1100 is operating in the synchronous mode, the AGC receiver 1101 is kept in a "receiver-off" mode during one or more frames, or cycles, in which the radio 1100 expects to receive no pertinent new information (but the radio 1100 remains essentially synchronous with the synchronous signaling protocol). When the AGC receiver 1101 is powered on at step 205, the gain control value 194 is at a Lowest Gain, having been set to the Lowest Gain at the time of power down of the AGC receiver 1101. In accordance with the preferred embodiment of the present invention, this Lowest Gain is a setting that is lower than a Minimum gain control value that is used during normal adjustments of the LNA 116 during the Track Mode 172. The Lowest Gain is achieved by essentially shutting the LNA 116 off. At step 210, the step attenuator 114 is set to the attenuation state. At step 215, DC offset correction is performed, which lasts 625 microseconds. At step 220, the gain control value is then set to the Minimum gain control value. At step 225, the recovered signal power, having a binary value, MAG, of the binary voltage squared signal 165, is determined during a measurement period starting 650 microseconds after the DC offset correction is completed, and lasting 1.250 milliseconds. The binary voltage squared signal 165 is also referred to as a first amplitude recovered signal with these settings of the step attenuator 114 and LNA 116. A comparison of MAG (of the first amplitude recovered signal) to the AGC¯THRES is made at step 230. When MAG is greater than AGC¯THRES, the step attenuator 114 is left in the attenuation state and the AGC system 100 is changed to the track mode 172, at step 265. In an example of a VHF receiver embodiment of the present invention, the intercepted signal power is greater than −21 dBm (decibels referenced to 1 milliwatt) when MAG is greater than AGC¯THRES under these settings. When MAG is less than or equal to AGC¯THRES, the LNA 116 is set to a Maximum gain at step 235 and the recovered signal power, MAG, which will typically have been increased by the increased gain of the LNA 116, is again determined, this time during a measurement period starting 650 microseconds after the LNA 116 gain is changed, and lasting 1.250 milliseconds, at step 240. The binary voltage squared signal 165 is referred to as a second amplitude recovered signal with these settings of the step attenuator 114 and LNA 116. At step 245, when MAG (of the second amplitude recovered signal) is greater than AGC__THRES, the step attenuator 114 is left in the attenuation state and the AGC system 100 is changed to the track mode 172, at step 265. In the example of the VHF receiver, the intercepted signal power is greater than −62.5 dBm when MAG is greater than AGC¯THRES under these settings. When MAG is less than or equal to AGC¯THRES, the step attenuator 114 is set to the non-attenuation state at step 250 and the recovered signal power, MAG, which will typically have been increased by the reduced attenuation of the step attenuator 114, is again determined, this time during a measurement period starting 650 microseconds after the step attenuator 114 setting is changed, and lasting 1.250 milliseconds, at step 252. The binary voltage squared signal 165 is referred to as a third amplitude recovered signal with these settings of the step attenuator 114 and LNA 116. When MAG (of the third amplitude recovered signal) is greater than AGC¯THRESWU at step 255, the step attenuator 114 is reset to the attenuation state and the AGC system 100 is changed to the track mode 172, at step 265. In the example of the VHF receiver, the intercepted signal power is greater than −79.5 dBm when MAG is greater than AGC¯THRES under these settings. When MAG is less than or equal to AGC¯THRESWU at step 255, the step attenuator 114 is left in the non-attenuation state and the AGC system 100 is changed to the track mode 172, at step 265. By these decisions, it can be seen that the step attenuator 114 is set to one of the attenuation state and the pass through state by the commencement of the normal data portion of the received signal.

Track Mode

Referring now to FIG. 3, a map of a set of registers that hold the stored gain response 180 is shown, in accordance with the preferred embodiment of the present invention. The set of registers is preferably implemented as a plurality of register storage locations specifically designed for the purpose of holding the stored gain response 180. At each of a predetermined number of storage locations, identified as locations 0 to 19 in the example shown in FIG. 3, there is a set of VALUE ADJUSTMENT registers for storing a gain control value adjustment. A predetermined maximum gain control value (identified in FIG. 3 as $O_7$–$O_0$), which in this example is 31, is the value adjustment associated with storage location 0. The other value adjustments are measured and stored during the calibrate mode 173, using a conducted RF signal of fixed power that is coupled to a conducted input 111 (FIG. 1). (Use of the conductive input 111 switches off the intercepted signal 113 from the antenna 112 at the step attenuator 114.) Each location is associated with a gain that is very close to being 3 dB lower in value from a gain associated with a next higher ordinal location. Thus, the locations have gains associated with them as shown in the GAIN column of FIG. 3 (but the GAINS are not stored). Each value adjustment stored at the locations other than 0 is a value adjustment that represents the approximate change in the gain control value 194 that is needed to change from the gain of LNA 116 at the lower location to the gain of LNA 116 associated with the location. It will be appreciated, then, that a gain control value 194 at a particular location for a particular relative gain is derived from the maximum gain control value and the value adjustments for the locations up to an including the particular location. The gain control value 194 so derived, when applied to the LNA 116 by the gain control signal 194 generated by the DAC 190, provides essentially the same gain reduction from the maximum gain at location 0 as achieved during the calibrate mode 173. However, it should be appreciated that the absolute binary value of the binary voltage squared signal 165 at a particular gain control value may be different in the track mode 172 than in the calibrate mode 173, because the power of the intercepted signal 113 in the track mode 172 can be, and typically will be, different than the power of the conducted RF signal used for the calibrate mode 173. Importantly, it will be appreciated that the gain control value 194 can be adjusted by subtracting or adding, respectively, the value adjustment associated with a next higher or lower location, resulting in a plus or minus 3 dB change in the power of the recovered signal 165. A pointer register holds a current value of a location that is associated with a gain that is set by a present value of the gain control value 194 that has been determined from the value adjustments associated with all the locations between 0 and the location being pointed to. It will be appreciated that the stored gain response is preferably a dedicated set of registers, but could alternatively be any other type of memory such as a portion of processor registers or other memory such as random access memory (RAM), in which case the pointer value is added to a base address in a conventional manner to recover the gain and value adjustment. It will also be appreciated that the use of value adjustments reduces the amount of storage necessary to regenerate a gain control value, in comparison to storing the absolute gain control value for each desired relative gain. In accordance with the preferred embodiment of the present invention, the value adjustments are stored in two bits for each storage location. For example, the two bits associated with storage location 5, where the pointer is presently pointing, are identified as X5,1 and X5,0.

Figure 4:
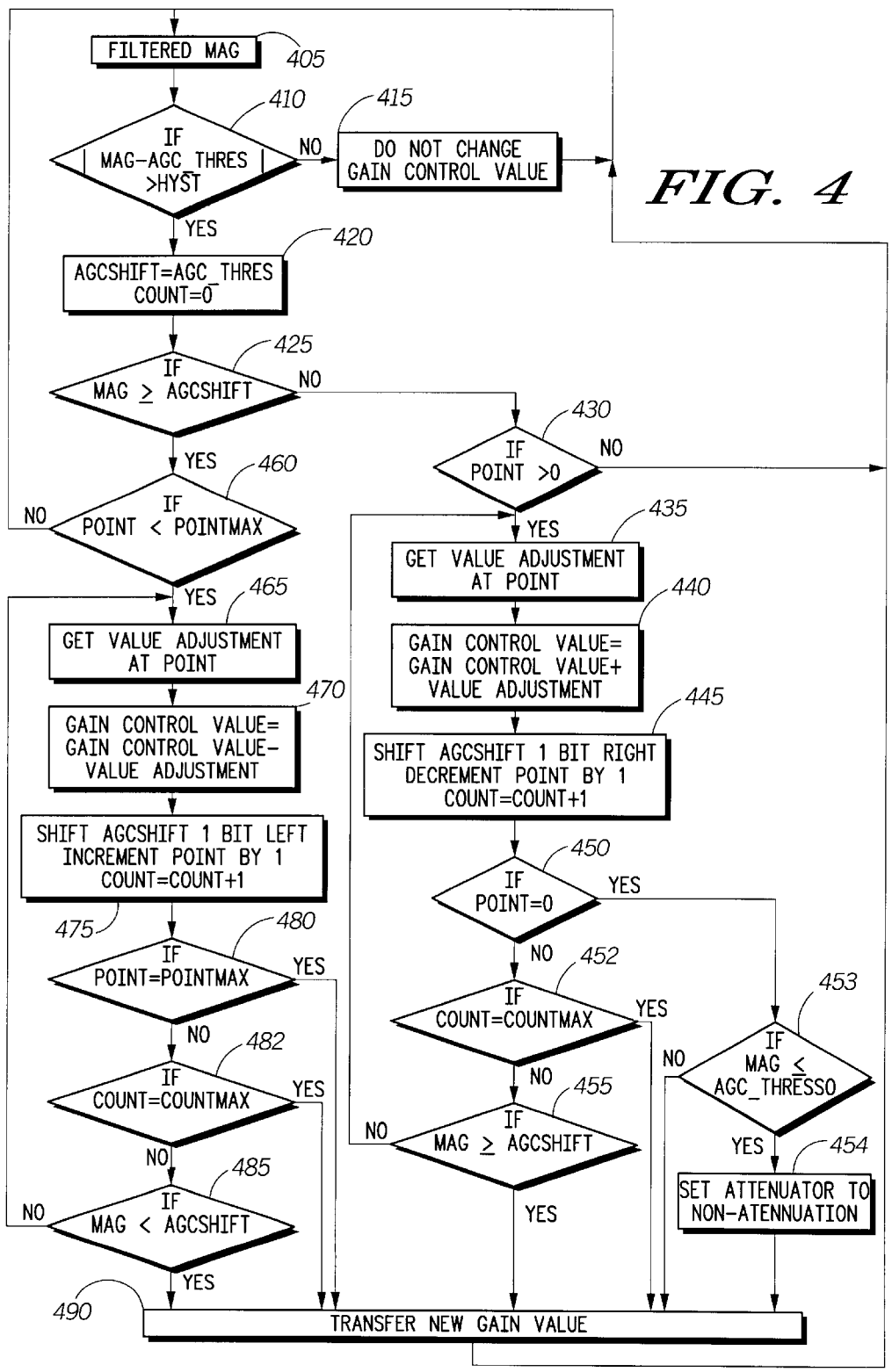
FIG. 4 is a flow chart that shows a track mode, in accordance with the preferred embodiment of the present invention.

Referring to FIG. 4, a flow chart of the track mode 172 is shown, in accordance with the preferred embodiment of the present invention. At step 405, the binary value, MAG, of the filtered-binary voltage squared signal 165 is acquired and tested at step 410 to determine whether it differs from AGC⎯THRES by more than a predetermined hysteresis, HYST, which is preferably 3 dB. If it is not, then no change is made in the gain control value at step 415, and the process awaits the next measured MAG at step 405. When the absolute value of (MAG-AGC⎯THRES) is greater than HYST, then a variable representing a shifted AGC⎯THRES, named AGCSHIFT, is set equal to AGC⎯THRES, and a variable that counts steps of the gain control value, named COUNT, is set to 0, at step 420.

If MAG is greater than or equal to AGCSHIFT at step 425, then if the pointer (POINT) is less than the maximum pointer value (POINTMAX) at step 460, the value adjustment at POINT is acquired at step 465 and used at step 470 to decrease the gain control value by the value adjustment amount. If, however, POINT is equal to POINTMAX at 460 no change is made to the gain control value (it is already at a value that sets the gain of LNA 116 to a minimum gain), and the process awaits the next measured MAG at step 405. Next, at step 475, AGCSHIFT is shifted 1 bit left, POINT is incremented by 1, and COUNT is incremented by 1. Next, If POINT is equal to POINTMAX the newly determined gain control value (which is at the value that sets the gain of LNA 116 to a minimum gain) is coupled at step 490 to the LNA 116 at the next symbol edge, as described above, and the process awaits the next measured MAG at step 405. If however, at step 480, POINT is not equal to POINTMAX, and COUNT is not equal to COUNTMAX at step 482, and MAG is not less than AGCSHIFT at step 485, then the process continues at step 465 to determine whether another approximately 3 dB decrease in gain is appropriate in an attempt to make MAG<AGCSHIFT at step 485. If COUNT is equal to COUNTMAX at step 482, then the newly determined gain control value is coupled at step 490 to the LNA 116 at the next symbol edge, and the process awaits the next measured MAG at step 405. This limit is used to prevent gain changes of absolute value larger than approximately (3 dB)*(COUNTMAX). COUNTMAX is set to 6 (approximately 18 dB) for a typical combination of radio environment and radio type. If MAG is less than AGC-SHIFT at step 485, then the newly determined gain control value is coupled at step 490 to the LNA 116 at the next symbol edge, and the. process awaits the next measured MAG at step 405.

If MAG is less than AGCSHIFT at step 425, then if the pointer (POINT) is greater than the minimum pointer value (0) at step 430, the value adjustment at POINT is acquired at step 435 and used at step 440 to increase the gain control value by the value adjustment amount. If, however, POINT is not greater than 0 at 430 no change is made to the gain control value (it is at a value that sets the gain of LNA 116 to a maximum gain), and the process awaits the next measured MAG at step 405. Next, at step 445, AGCSHIFT is shifted 1 bit right, POINT is decremented by 1, and COUNT is incremented by 1. Next, If POINT is equal to 0 and if MAG is less than or equal to AGC⎯THRESSO at step 453, the step attenuator 114 is set to the non-attenuate state at step 454, the newly determined gain control value is coupled at step 490 to the LNA 116 at the next symbol edge, and the process awaits the next measured MAG at step 405. If POINT is equal to 0 at step 450 and if MAG is greater than AGC⎯THRESSO at step 453, the step attenuator 114 is kept in the attenuation state, the newly determined gain control value is coupled at step 490 to the LNA 116 at the next symbol edge, and the process awaits the next measured. MAG at step 405. If however, at step 450, POINT is not equal to 0, and COUNT is not equal to COUNTMAX at step 452, and MAG is not greater than or equal to AGCSHIFT at step 455, then the process continues at step 435 to determine whether another approximately 3 dB increase in gain is appropriate in an attempt to make MAG>=AGCSHIFT at step 455. If COUNT is equal to COUNTMAX at step 452, then the. newly determined gain control value is coupled at step 490 to the LNA 116 at the next symbol edge, and the process awaits the next measured MAG at step 405. This limit is used to prevent gain changes of absolute value larger than approximately (3 dB)*(COUNTMAX). If MAG is greater than or equal to AGCSHIFT at step 455, then the newly determined gain control value is coupled at step 490 to the LNA 116 at the next symbol edge, and the process awaits the next measured MAG at step 405.

It will be appreciated that there are variations of the track mode that are obvious to one of ordinary skill in the art, that could be used to accomplish the same results as achieved by the preferred embodiment of the present invention. In one alternative embodiment that has been implemented, the track mode technique described in FIG. 4 is used, except that the gain control value is not changed as described in steps 470, 440 and the pointer value (POINT) is not changed in steps 475 and 445. Then, when a YES is determined at one of steps 485, 455 respectively, another loop is performed COUNT times, each time adjusting pointer value POINT by one and changing the gain control value by the adjustment value associated with each value of POINT, and then the new gain value is transferred at step 490. In other examples of variations to the preferred embodiment, MAG could be shifted instead of the AGC⎯THRES to determine the COUNT needed to produce the MAG that is 3 dB different than the previous one; the direction. of increase for the pointer could be reversed; steps 470 and 475 could be reversed, etc. Furthermore, there are certain aspects of the track mode that if not performed will reduce but not eliminate all the benefits of the present invention. For example, steps 482 and 452 could be left out with a consequence that the gain would be allowed to fluctuate more under some circumstances, making the AGC system 100 somewhat less stable in those circumstances.

It will be further appreciated that the use of the binary voltage squared signal and the stored gain response in this AGC system allows gain changes in multiples of approximately 3 dB, by shifting AGCSHIFT 1 bit left or right as needed to determine new gain values, which makes the circuitry to implement this technique very simple compared to prior art AGC systems, and makes the control of the gain linear with reference to power. Without this linearity, the system could over-shoot and possibly oscillate with input power changes of the intercepted signal 113. Furthermore the ability of this AGC system 100 to provide a wide range of gain. changes, for example varying between 3 dB and 18 dB, in one AGC update cycle makes this AGC system run at faster time constants than prior art AGC systems. This AGC system 100 allows for a controlling processor to vary the gain change sizes by varying COUNTMAX, which can be reduced when the AGC system is operating near the AGC threshold, thereby reducing the settling time and improving the stability of the AGC system 100 compared to prior art AGC systems.

The AGC Filter

Figure 5:
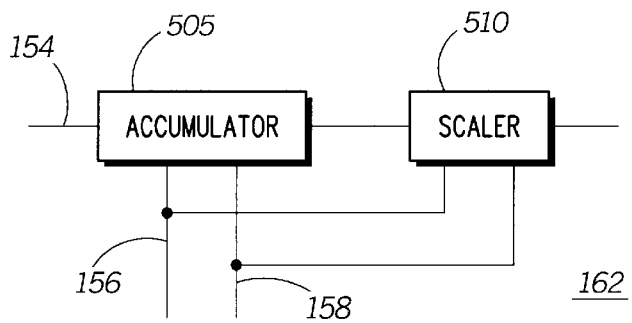
FIG. 5 is an electrical block diagram of an AGC filter in the AGC system, in accordance with the preferred embodiment of the present invention.
Figure 6:
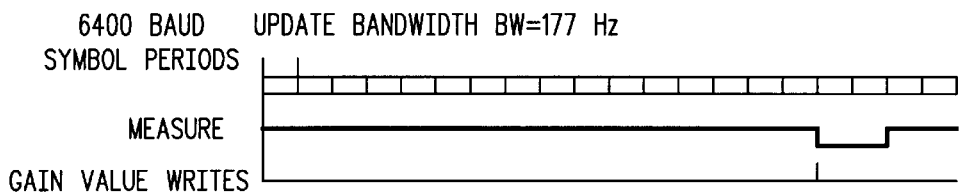
FIGS. 6, 7, 8, and 9 are timing diagrams that show reset and accumulate durations (as portions of a signal labeled MEASURE), and gain control value updates (writes) with reference to symbol periods of 6400 baud symbols, in accordance with the preferred embodiment of the present invention.
Figure 7:
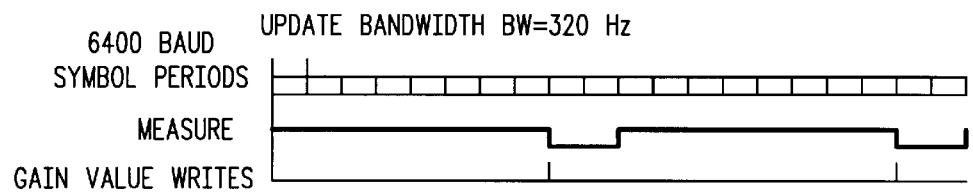
Figure 8:
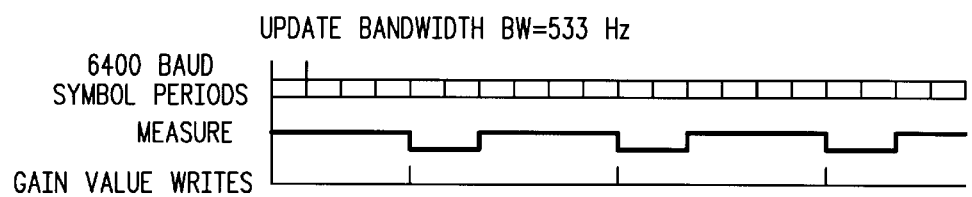
Figure 9:
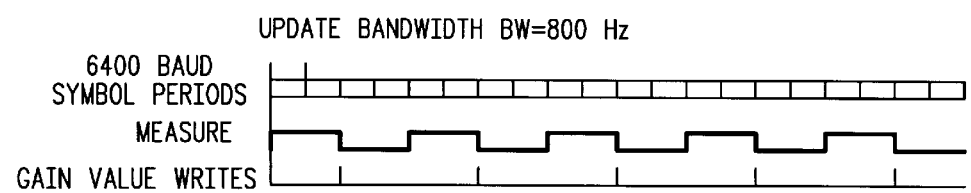

Referring to FIG. 5, an electrical block diagram of the AGC filter 162 is shown, in accordance with the preferred embodiment of the present invention. The AGC filter 162 comprises an accumulator 505 coupled to an input of a scaler 510. Coupled to both the accumulator 505 and the scaler 510 are the bandwidth signal 156 and the symbol rate signal 158.

The accumulator 505 is controlled by the signals 156, 158 as shown in Table 1, to accumulate the number of samples shown, the accumulation having the duration shown, during one gain control update cycle.

TABLE 1

| BANDWIDTH (Hz) | SYMBOL RATE (Symbols per Sec.) | ACCUMULATION SAMPLES (#) | ACCUMULATION DURATION (usec.) |
| --- | --- | --- | --- |
| 800 | 1600 | 15 | 625 |
| 800 | 3200 | 30 | 625 |
| 533 | 1600 | 30 | 1250 |
| 533 | 3200 | 60 | 1250 |
| 320 | 1600 | 60 | 2500 |
| 320 | 3200 | 120 | 2500 |
| 177 | 1600 | 120 | 5000 |
| 177 | 3200 | 240 | 5000 |

The accumulator 505 is further controlled by the symbol rate signal 158 as shown in Table 2, to stay cleared in the reset state for the number of samples shown, the reset state having the duration shown, at the beginning of each gain control update cycle.

TABLE 2

| SYMBOL RATE (Symbols per Sec.) | RESET SAMPLES (#) | RESET DURATION (usec.) |
| --- | --- | --- |
| 1600 | 14 | 583 |
| 3200 | 29 | 604 |

Referring to FIGS. 6, 7, 8, and 9, timing diagrams show the reset durations and accumulate durations (as portions of the signal labeled MEASURE) in comparison to symbol periods of 6400 baud symbols (labeled as 6400 BAUD SYMBOL PERIODS), and show the gain control-value update that occurs during each of the gain control value update cycles (labeled as GAIN VALUE WRITES), in accordance with the preferred embodiment of the present invention. These relationships are shown for four different loop bandwidths: 177 Hz in FIG. 6, 320 Hz in FIG. 7, 533 Hz in FIG. 8, and 800 Hz in FIG. 9. It will be appreciated from these figures that the accumulate durations for different loop bandwidths have a relationship of $2^M$, while the reset durations are essentially constant. It will be further appreciated from Tables 1 and 2 that the accumulate durations and the reset durations for different symbol rates are essentially the same for a particular bandwidth.

The output of the accumulator is 15 to 240 times the average amplitude of the unfiltered recovered signal 154. This accumulator output is then reduced by the scaler 510 by a first gain scaling as shown in Table 3.

TABLE 3

| BANDWIDTH (Hz) | SYMBOL RATE (Symbols per Sec.) | Shift right (Number of bits) |
| --- | --- | --- |
| 800 | 1600 | 4 |
| 800 | 3200 | 5 |
| 533 | 1600 | 5 |
| 533 | 3200 | 6 |
| 320 | 1600 | 6 |
| 320 | 3200 | 7 |
| 177 | 1600 | 7 |
| 177 | 3200 | 8 |

After this first scaling, the signal has a value of 15/16 of one sample. This value is then normalized by a second scaling of 17/16, which yields an output which is approximately the average value of the samples in the accumulator, normalized to one sample, regardless of the selected incoming symbol rate and filter bandwidth (which is the loop bandwidth). This simple filter scaling allows the AGC system 100 to use one set of AGC threshold values for a radio, that are independent of the selected bandwidth and symbol rate, a feature not available in prior art AGC systems.

It will be appreciated that the above relationships can be expressed more generally as: The symbol rate signal 158 indicates one of at least two symbol rates that have a factor of two relationship with each other. The accumulator 505 generates a binary output that is an accumulation of a quantity of the samples occurring during one gain control value update cycle. The ratio of the quantities for any two symbol rates is essentially inversely proportional to the ratio of the two symbol rates. The scaler performs a reduction of the binary output by a factor that is essentially equal to the quantity, by a binary right shift operation. The quantity is given by the formula $((2^N)-1)*2^M$. N and M are integers. The binary right shift operation shifts the output right M+N bits. The factor is $2^N*2^M$. The scaler performs an adjustment of the reduced binary output of $((2^N)+1)/(2^N)$.

The RSSI Function

Figure 10:
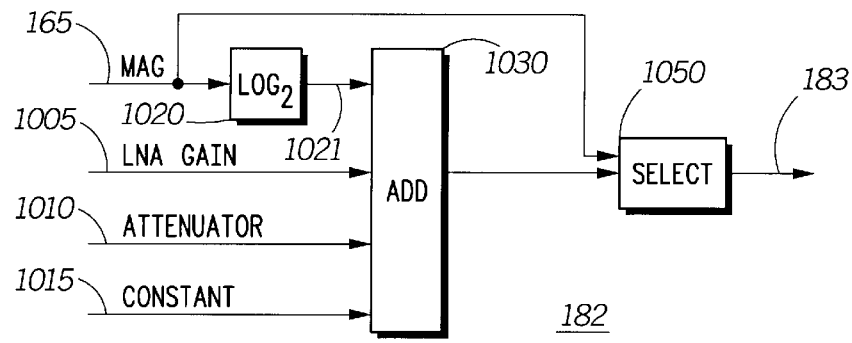
FIG. 10 is an electrical block diagram showing an RSSI function of the AGC system, in accordance with the preferred embodiment of ,the present invention.

Referring to FIG. 10, an electrical block diagram of the RSSI function 182 is shown, in accordance with the preferred embodiment of the present invention. The RSSI function 182 comprises a log function ($LOG_2$) 1020, an addition function (ADD) 1030, and a selection function 1050 (SELECT). The addition function 1030 adds together four binary values. One is a LNA GAIN 1005 obtained from the stored gain response 180. The LNA GAIN 1005 represents the most recent relative gain to which the LNA 116 has been set; that is, the difference in dB from the maximum gain of the LNA 116, in 3 dB steps. This is preferably obtained by a count of the gain steps (pointer location steps) from the maximum gain to the present pointer location, and is preferably 4 bits wide. Another is an ATTENUATOR signal 1010 having a value that represents, in 3 dB steps, the attenuation of the step attenuator 114 relative to the non-attenuation state, in dB (e.g., 0 or 18), and is preferably 3 bits wide. A third is a 5 bit binary Mu-law signal 1021 generated by the $LOG_2$ function 1020. The value of this Mu-law signal 1021 is the ordinal position of the highest order bit of the value, MAG, of the binary voltage squared signal 165 that has a "1" value, and is preferably 5 bits wide. The Mu-law signal 1021 is an approximation of $Log_2(MAG)$. The fourth is a constant 1015 that generates a result of zero from the output of the addition function 1030 when the constant is added to a $LOG_2$ signal 1021 that is generated while a 0 dBm signal is injected into the conducted input 111 (FIG. 1) (or intercepted by the antenna 112), the LNA 116 is operated at maximum gain, and the step attenuator 114 is in the non-attenuation state. The constant 1015 is preferably a 5 bit wide value. The output of the addition function 1030 is a binary value of width X that represents the power in dBm of the intercepted signal 113. This is termed the low resolution RSSI, and it is selected by the selection function 1050 when the AGC system 100 is in the track mode 172. When the low resolution RSSI output is selected, it is coupled to a host processor of the radio 1100 which includes the low resolution RSSI output in messages that are sent to a fixed portion of a radio communication system. The low resolution RSSI is used to perform such operations as fixed transmitter power adjustment and fixed transmitter selection, and is also used within the AGC radio 1100 (FIG. 11), for. example, in performing error correction of recovered signals. In the preferred embodiment of the present invention, X is 10. It will be appreciated that because the low resolution RSSI is used for purposes that tolerate a much longer delay time than can be tolerated by the loop of the AGC system 100, the log function 1020, the addition function 1030, and the selection function 1050 are preferably performed in a host processor of the radio 1100 instead of being implemented in the portions of the custom integrated circuit preferably used for the other unique digital functions of the AGC system 100.

During the suspend test mode 174, the selection function 1050 selects the value, MAG, of the binary voltage squared signal 165. The full bit width, W, of the value MAG is passed to the output of the selection function 1050 in the track mode 172 and coupled to a host processor of the radio 1100. The host processor couples this high resolution, uncorrected, filtered signal to a measurement instrument during a factory tuning operation. In accordance with the preferred embodiment of the present invention, W is 21, which provides a resolution of 0.01 dB and a total range of 63 dB. This allows a highly accurate peak tuning to be performed, making possible a simplified, precision, automatic radio tuning.

Referring to FIG. 11, an electrical block diagram of the radio 1100 is shown, in accordance with the preferred embodiment of the present invention. The radio (also referred to as an AGC radio) comprises the antenna 112 coupled to an AGC receiver 1101 that includes the AGC system 100. The AGC receiver 1101 is preferably a ZIF or direct conversion receiver but could be of another type. The recovered I and Q signals 145, 147 are coupled from the AGC system 100 of the AGC receiver 1101 to the controller 1105, which demodulates and decodes them and processes information included in the I and Q signals, in a conventional manner. The controller 1105 performs conventional functions such as protocol symbol synchronization and demodulation, protocol decoding, error decoding, address checking, etc. The controller 1105 comprises one or more conventional microprocessors combined with appropriate stored program instructions. Information decoded from the I and Q signals 145, 147, and information generated within the controller 1105 is coupled to the display 1115 for presentation to a user. The AGC radio 1100 also comprises other conventional user interfaces such as switches (not shown in FIG. 11), and can optionally include one or more other conventional user interface elements such as a speaker, vibrator, and LED indicators (not shown in FIG. 11), and can optionally include a transmitter (not shown in FIG. 11) coupled to the antenna 112. The controller 1105 controls the AGC receiver 1101 to select a particular radio channel and to go into various operational modes by means of control signal 1110. During the track mode 172 in a radio having a transmitter, the low resolution RSSI is generated, and coupled by the RSSI signal 183 to the controller 1105, which couples an encoded version of the low resolution RSSI to the transmitter via serial signal 1120 to inform a fixed network of the received signal strength. When the AGC radio 1100 is being manufactured, the AGC radio 1100 is put into the suspend test mode 174, during which mode the high resolution RSSI is coupled to the controller 1105, which couples the high resolution RSSI via serial signal 1120 to a factory tuning equipment, where it is used to optimally tune the radio 1100. It will be appreciated that alternatively, the high resolution RSSI can be encoded and transmitted when the AGC radio includes a transmitter, which can reduce manufacturing costs by eliminating wired connection to the AGC radio for the purpose of obtaining the high resolution RSSI.

Other architectures are contemplated in the block diagram of FIG. 11. For example, the symbol demodulation and synchronization functions referred to above can alternatively be accomplished by a digital signal processor that performs the functions of the magnitude corrector 170 and other portions of the receiver 1101 described above It will be appreciated that although the AGC system 100 has been described in the context of a radio frequency receiver, the present invention will provide similar benefits in other types of receivers, an example of which is an infrared light receiver.

Determining the Stored Gain Response

Figure 12:
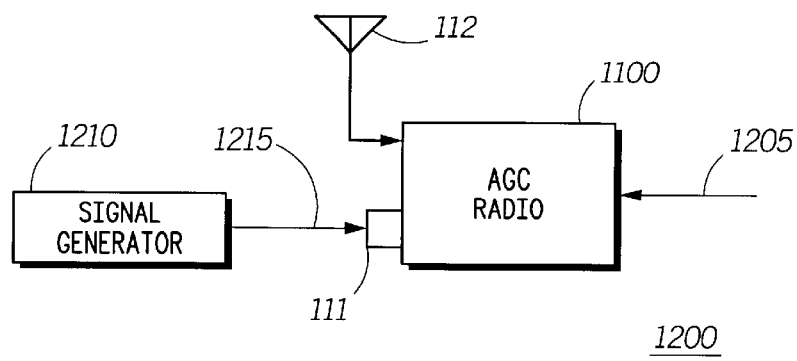
FIG. 12 is an electrical block diagram showing a test setup for determining a stored gain response for the radio, in accordance with the preferred embodiment of the present invention.

Referring to FIG. 12, an electrical block diagram 1200 of a calibration setup for determining and storing the stored gain response of the radio 1100 is shown, in accordance with the preferred embodiment of the present invention. The calibration setup comprises a signal generator 1210 that is coupled to the conducted input 111 of the AGC radio 1100. A signal 1205 is coupled to the AGC radio 1100 that puts the AGC radio into the calibrate mode 173 and starts a calibration process. The signal generator generates a constant power level signal 1215, that can be within several dB of a predetermined signal level; it need not be set precisely to the predetermined signal level because the calibration and use of the unique stored gain response obviates the need for use of an absolute signal level. This reduces the cost of the test procedure. The calibration described herein can alternatively be performed using a radiated coupling of the calibration signal into the AGC radio 1100, instead of a conducted coupling, as long as the power level of the signal intercepted by the AGC radio 1100 remains constant during the calibration procedure. This is another advantage of the procedure, since several AGC radios 1100 could be calibrated simultaneously.

Figure 13:
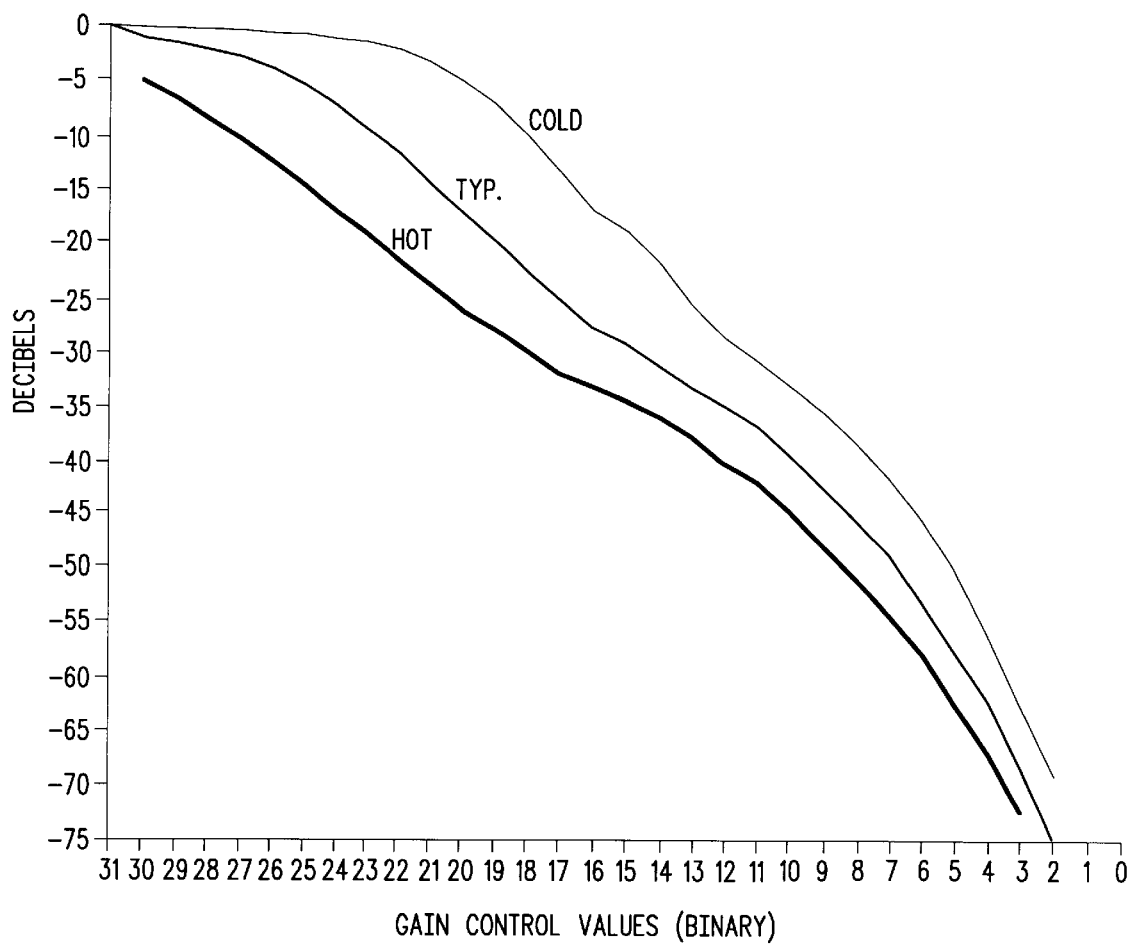
FIG. 13 is a graph showing plots of gain versus gain control values for a typical low noise amplifier of the AGC system, in accordance with the preferred embodiment of the present invention.

Referring to FIG. 13, a graph showing plots of gain (in dB relative to a maximum gain referenced to 0 dB) versus the digital gain control values 194 (FIG. 1) coupled to the DAC 190, for a typical LNA 116 of the AGC system 100 is shown, in accordance with the preferred embodiment of the present invention. Three curves are shown, one at a hot temperature, one at a normal ("TYP.") temperature, and one at a cold temperature. The gains are essentially all negative gains because they are losses with reference to the amount of gain of the LNA 116 at the maximum gain control value, which in this example, is a digital value of 31. It will be appreciated that the curves are non-linear, and since the vertical scale is logarithmic, the LNA 116 is properly described as a non-logarithmic amplifier. It will be further appreciated that when the gain control value 194 is set to zero, the LNA 116 is shut down, and is therefore in a unique state of lowest gain, as described with reference to block 205 of FIG. 2.

Figure 14:
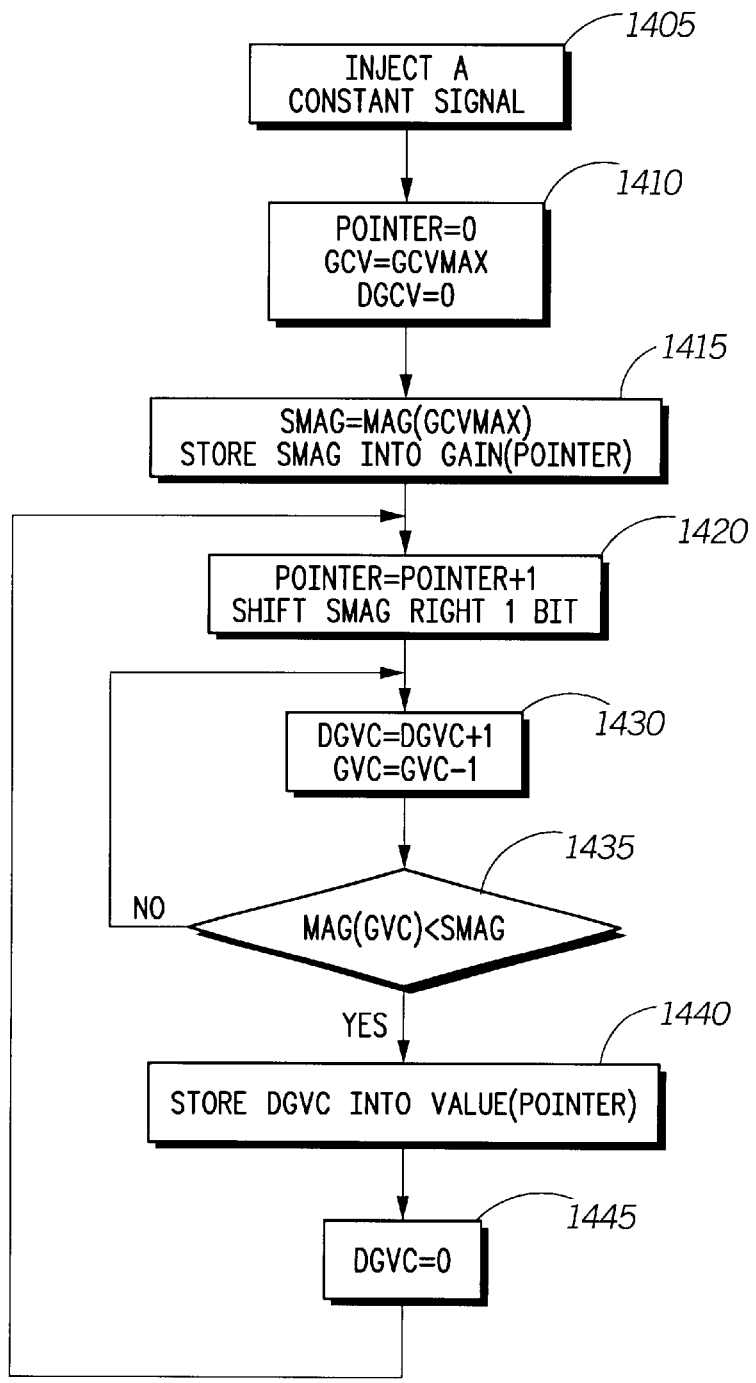
FIG. 14 is a flow chart showing a method for determining a stored gain response for the AGC system, in accordance with the preferred embodiment of the present invention.

Referring to FIG. 14, a flow chart of a method for determining the stored gain response for the AGC system 100 is shown, in accordance with the preferred embodiment of the present invention. At step 1405, the signal of constant power level has a predetermined type of modulation 1215 (in some types of systems, an modulated signal can be used) and is coupled to the conducted input 111 of AGC radio 1100. At step 1410, the controller 1105 initializes the pointer to value 0, initializes the gain control value (GCV) 195 to a maximum gain control value, GCVMAX, which in this example is a digital value of 31, and initializes a gain control step counter, DGCV, to 0. At step 1415, a value named "shifted recovered signal power", SMAG, is initialized to the value of the recovered power, MAG(GCVMAX), that is measured at GCVMAX. Also, GCVMAX is stored into the stored gain response registers at the value adjustment (VALUE(0)) associated with the maximum gain, at location 0. Then, at step 1420, the pointer is incremented by 1 and SMAG is shifted right by 1 bit. At step 1430, the step counter, GCV, is incremented by 1, and the gain control value 194 is decremented by 1. The recovered signal power at the current gain control value, AG(GCV) is compared to SMAG, and if it is greater than or equal to SMAG at step 1435, then at step 1440, the value of the gain control counter (DGCV) is stored into the value adjustment (VALUE (POINTER)) associated with the current value of the pointer, the gain control counter (DGCV) is reset to 0 at step 1445, and the method continues at step 1420.

When MAG(GCV) is less than SMAG at step 1435, then the method continues at step 1430. The method continues until the pointer reaches a maximum value (in this example, 19), at which point the stored gain response is complete. By this method, a gain response is stored that provides a logarithmic gain response for the combination that includes the gain corrector 170 and the non-logarithmic LNA 116; which is to say that linear changes of the a binary voltage squared signal (165) cause essentially logarithmic changes at the output of the LNA 116.

It will be appreciated that the method just detailed can be described in other words as follows: The shifted recovered signal power, SMAG, is alternatively described as a relative binary voltage square signal, since it is determined relative to the recovered signal power measured at the maximum gain control value by repeated right shifts of the maximum gain control value.

The comparison performed at step 1435 is alternatively described as comparing a binary voltage squared value of the recovered signal (MAG(GCV)) generated at a second gain control value and a relative binary voltage squared value (SMAG) (obtained by shifting a relative binary voltage squared value associated with a first gain control value) to determine a sign of a difference of the values. Step 1430 can be described as determining the number of times the step of comparing is repeated. The loop comprising steps 1430, 1435 comprises a repetition until the sign of the difference is a predetermined value (in the example detailed, until MAG(GCV)<SMAG). Finally, step 1440 can be described as storing, as a value adjustment, the number of times (DGCV) the step of comparing is repeated between two consecutive steps (1435) of determining a sign of the difference.

It will be further appreciated that this method of storing a gain response curve is much easier and faster than prior art manual methods, and requires no adjustments of the signal generator to accomplish.

The gain response function that is stored by this method can be fundamentally described as comprising an ordered set of registers, wherein each register stores a gain adjustment value, and a gain control output, wherein each of the gain adjustment values is a value that, when subtracted from or added to a present value of the gain control output, generates a new value of the gain control output that is different than the present value by an amount that changes the gain of the non-logarithmic amplifier essentially by a predetermined number of decibels.

Alternatively, the stored gain response can be described as comprising an ordered set of registers having a first register, wherein each register except the first register stores a gain adjustment value, a pointer coupled to a digital input that points to one of the registers (the pointed register) and a gain control value output. The gain control output is generated as the sum of the value stored in the pointed register and all of the values stored in the registers between the first register and the pointed register, combined by subtraction or addition with the value stored in the first register, wherein the gain adjustment values are such that the gain control output controls the non-logarithmic amplifier in a logarithmic manner with reference to the digital input.

It will be further appreciated that gain responses at a plurality of temperatures can be stored in the AGC radio 1100 in relatively small amounts of memory, and can used in conjunction with a temperature measured by the AGC radio 1100 to further refine the accuracy of the gain adjustments made within the AGC system 100. For example, three gain curves such as those shown in FIG. 13 can be stored. during factory calibration, with the hot and cold curves taken at the maximum and minimum operating temperatures for the AGC radio 1100. Then, during operation, the AGC radio measures the temperature within the AGC radio 1100, for example, at a heat sink of the LNA 116, and compares the measured temperature to temperatures measured at the heat sink during the factory calibration. A linear interpolation of two of the three gain control values can then be used to determine a refined gain control value that is used for the gain control value 194.

The Squaring Function

Figure 15:
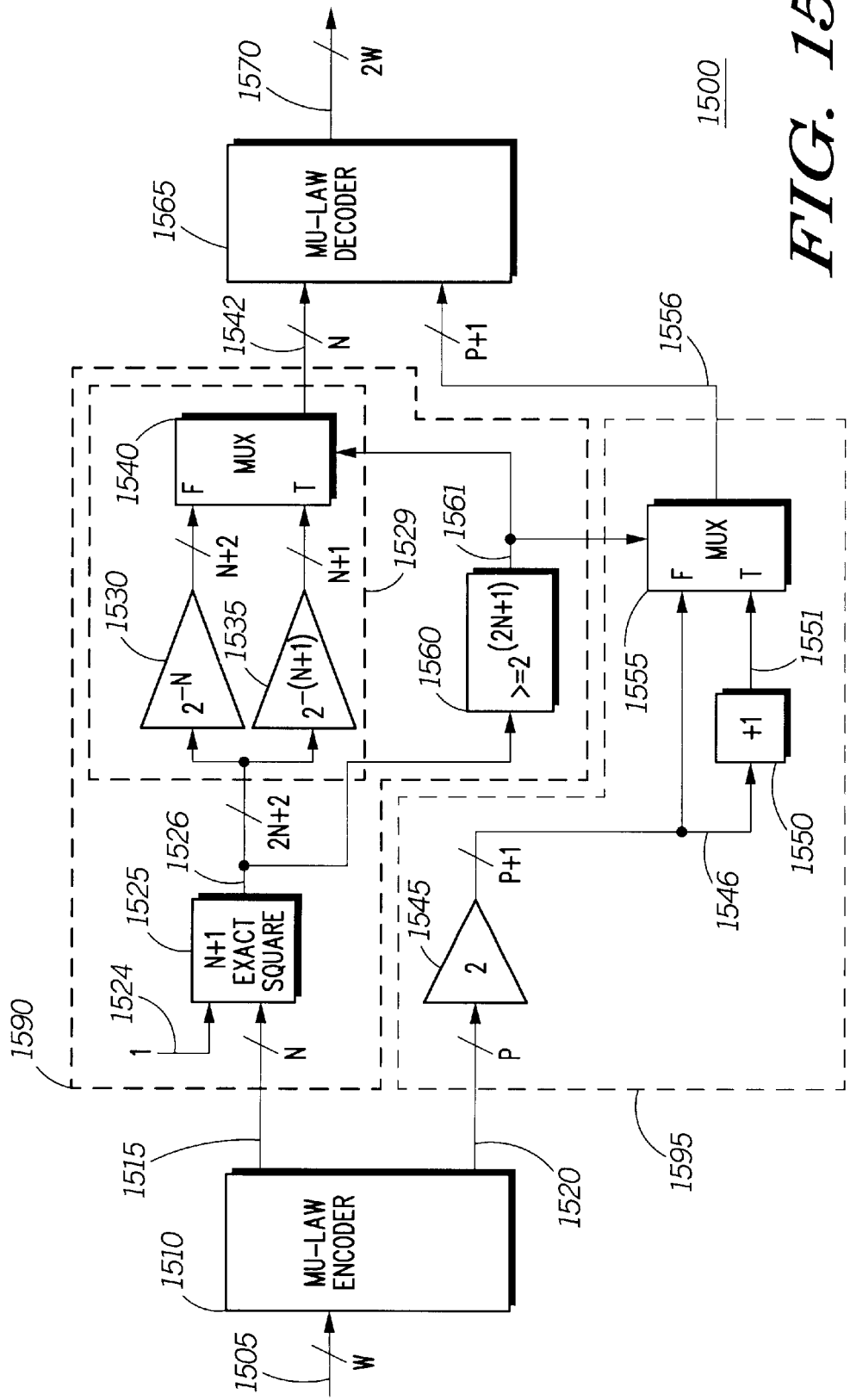
FIG. 15 is an electrical block diagram showing a squaring circuit used in the AGC system, in accordance with the preferred embodiment of the present invention.

Referring now to FIG. 15, an electrical block diagram of a squaring circuit 1500 that is used for each of the two squaring functions 148,150 (FIG. 1) is shown, in accordance with the preferred embodiment of the present invention. The two squaring circuits are preferably implemented as logic circuits that are part of a state machine included in a custom integrated. circuit. The signals coupled to elements of the squaring circuits 1500 that are expressed herein as having width are binary parallel signals wherein the number of parallel lines is expressed as the width. The squaring circuit 1500 comprises a logarithmic compression function 1510, a doubling function 1595, a squaring function 1590, and a logarithmic decompression function 1565. The logarithmic compression function. 1510 accepts a binary input 1505 of width W and value X, and produces an output having a binary power component 1520 of value POWER, and a binary magnitude component 1515 of value MAGNITUDE, that together represent X to an predetermined amount of precision, N, which is to say the answer is accurate to N significant bits. The binary input 1505 of one of the squaring circuits 1505 is coupled to the I signal 145, and the binary input 1505 of the other of the squaring circuits 1505 is coupled to the Q signal 147. The squaring function 1590 generates an adjusted squared magnitude component 1542 of width N and a selection signal 1561 from MAGNITUDE. The doubling function 1595 generates a doubled power component 1556 based on POWER and the selection signal 1561. The logarithmic decompression function 1565 generates an approximate squared output of width 2W from the doubled power and adjusted squared magnitude components 1556, 1542, that has a value that approximates the square of X to the predetermined amount of precision, N. In accordance with the preferred embodiment of the present invention, W=32 and N=6.

In accordance with the preferred embodiment of the present invention, the logarithmic compression and decompression functions 1510, 1565 are Mu-law type functions. The logarithmic compression function 1510 generates the binary magnitude component 1515 with a width of N (N being a design choice) and the binary power component 1520 with a width of P, where $2^{(P-1)}<W<=2^P$ and wherein P and W are integers. In the preferred embodiment, P=5. The logarithmic compression function 1510 comprises a power function that generates POWER according to the relationship POWER=int($\log_2(X)$), and further comprises a magnitude function that generates MAGNITUDE according to the relationship MAGNITUDE=int($X*2^{(N-POWER)}$)$-2^N$. The circuitry to implement these relationships is well known to one of ordinary skill in the art. A specific example of the preferred embodiment is:

X=0000 0101 0111 1001 1101 0000 0001 1001
POWER=1 1010
MAGNITUDE=01 0111

The squaring function 1590 comprises an exact square function 1525 that generates an exact square signal 1526 that has width 2N+2 in response to the value of an augmented magnitude input that comprises the binary magnitude component 1515 augmented by a high order bit 1524. The squaring function 1590 preferably comprises a lookup table that generates the exact square signal 1526 having one of $2^{(N+1)}$ values for each value of the augmented magnitude input, the exact square having a value that is an exact square of the augmented input. Implementations other than a lookup table could be used, such as a conventional multiplication circuit dedicated to each exact square function 1590. For the example given above, the augmented magnitude input is 101 0111, and the exact square is 01 1101 1001 0001. The squaring function 1590 also comprises a steering circuit 1560 coupled to the exact square function 1525 that Uses a comparator to compare the value of the exact square signal 1526 to the binary value $2^{(2N+1)}$ and generate a steering signal 1561. The steering signal 1561 has a TRUE state when the value of the exact square signal 1526 is greater than or equal to the binary value $2^{(2N+1)}$, and has s FALSE state for the alternative result. In the example being described, $2^{(2N+1)}$ is $2^{13}$, so the steering signal 1561 is FALSE. The squaring function 1590 further comprises an adjustment function 1529 that generates the adjusted squared magnitude component 1542 from the exact square. The adjusted squared magnitude component 1542 has a precision and width of N bits. The adjustment function 1529 comprises a first integer-divider 1530 that performs an integer operation on the result of a division of the exact square signal 1526 by ($2^N$), a second integer-divider 1535 that performs an integer operation on the result of a division of the exact square signal 1526 by ($2^{(N+1)}$), and a multiplexer 1540 that selects the lowest N significant bits of the output of the first integer-divider 1530 when the state of the steering signal is FALSE or the lowest N significant bits of the output of the second integer-divider 1535 when the steering signal is TRUE. The selected bits are the adjusted squared magnitude component 1542. In the example being described, the first integer-divider 1530 is selected, so the adjusted squared magnitude component 1542 is 11 0110.

The doubling function 1595 preferably comprises a left shift function 1545 that generates a doubled power signal 1546 having a width of P+1 and a value double that of POWER by shifting the binary power component 1520 one bit left in a shift register, an adder 1550 that generates an augmented doubled power signal 1551 by adding a binary one to the value of the doubled power signal 1546 in an adder, and a multiplexer 1555 that generates the doubled power component 1556 by selecting the doubled power signal 1546 when the steering signal 1561 is FALSE and the augmented doubled power signal 1551 when the steering signal 1561 is TRUE. In the example being described, the steering signal 1561. is FALSE, so the doubled power component has a value of 11 0100.

It will be appreciated that in the squaring circuit 1500 described above, the squaring function 1590 generates the adjusted squared magnitude component 1542 having a value of ADJSQMAG, and the doubling function 1595 generates the doubled power component 1556 having a value of DBLPOWER, by the following relationships:

When $(MAGNITUDE+2^N)^2>=2^{(2N+1)}$,
  ADJSQMAG=N least significant bits of
    $int(((MAGNITUDE+2^N)^2)*2^{-(N+1)})$ and
  DBLPOWER=2*POWER+1;
When $(MAGNITUDE+2^N)^2<2^{(2N+1)}$,
  ADJSQMAG=N least significant bits of
    $int(((MAGNITUDE+2^N)^2)*2^{-N})$ and
  DBLPOWER=2*POWER.

The Iogarithmic decompression function 1565 generates the approximate squared output 1570 from ADJSQMAG and DBLPOWER, as:
  $(ADJSQMAG+2^N)*2^{(DBLPOWER-N)}$.

In the example being described, ADJSQMAG=11 0110 and DBLPOWER=11 0100 (Decimal 52) so the approximate squared output 1570 in this example=(111 0110)*$2^{46}$.

In a version of the squaring circuit 1500 in which W=32 and N=6, the squaring circuit 1500 reduces the required integrated circuit die area to less than 20% of that required for a prior art, non-sequential implementation, while providing a precision of at least 0.1 dB, so it will be appreciated that the cost and power savings of the present invention are substantial.

It will also be appreciated that in alternative embodiments the precision of the adjusted squared magnitude component 1542 can be increased up to 2N bits by changing the divisor of the first and second integer-dividers 1530, 1535. For example, a precision of 2N bits is achieved by changing the first integer-divider 1530 to one that performs no division operation on the exact square signal 1526, and by changing the second integer-divider 1535 to one that performs an integer operation on the result of a division of exact square signal 1526 by 2. In these alternative embodiments, although less shifting is performed in the integer-dividers 1530, 1535, more bits have to be multiplexed. in the multiplexer 1540 and handled at the input of the Mu-law decoder 1565.

It will be further appreciated that although the squaring circuit 1500 has been described with reference to a radio receiving circuit, it is useful in any integrated circuit and in any electronic device in which a need exists for a squaring function from which an approximate result is satisfactory, and that the amount of precision of the result can be adjusted by modifying the value of N.

While the preferred embodiments of the invention have been illustrated and described, it will be clear that the invention is not so limited. Numerous modifications, changes, variations, substitutions, and equivalents will occur to those of ordinary skill in the art without departing from the spirit and scope of the present invention as defined by the following claims.

What is claimed is:

1. An automatic gain control (AGC) system for a receiver, comprising:
   a magnitude generator that generates a binary voltage squared signal having a binary value that is directly proportional to a recovered signal power of an intercepted signal; and
   a gain corrector that determines a gain control value adjustment as a multiple of increments that are approximately 3 decibel (dB), by shifting a first value by one or more bits and comparing the shifted first value to a second value, wherein each of the first and second values are one of the binary voltage squared signal and a predetermined threshold.

2. The AGC system of claim 1, wherein the binary voltage squared signal is generated from a digital I squared signal plus a digital Q squared signal recovered from the intercepted signal.

3. The AGC system of claim 1, wherein the multiple is determined by first determining a sign of a difference of the first value and the second value, and shifting the first value in a direction determined by the sign until the sign of the difference changes.

4. he AGC system of claim 1, wherein a new gain control value is determined from the gain control value adjustment and a previously stored gain.

5. The AGC system of claim 1, wherein the new gain control value is limited by stored minimum and maximum gain limits.

6. The AGC system of claim 1, wherein the gain adjustment is further limited by a maximum gain adjustment amount.

7. The AGC system of claim 1, further comprising:
   a low noise amplifier (LNA) having an analog input and a gain,
   wherein the gain corrector uses the gain control value adjustment to determine a new gain control value that is a binary word, and further wherein the gain corrector compensates for delays in the AGC system and latches the new gain control value into a digital to analog converter (DAC) coupled to the analog input such that the gain of the LNA is changed essentially at a symbol edge time within the LNA.

8. The AGC system of claim 7, wherein the gain corrector latches the new gain control value only when the new gain control value is sufficiently different from a previous gain control value.

9. The AGC system of claim 7, further comprising an AGC filter coupled to the gain corrector, wherein, in response to the new gain control value being latched, the AGC filter is cleared and kept reset for a predetermined number of clock periods.

10. The AGC system of claim 9, wherein the AGC filter comprises:
    an integrator that generates an integrator output signal having a magnitude from an input signal coupled thereto, wherein the integrator is also coupled to a bandwidth signal that controls a bandwidth of the AGC filter; and
    a scalar coupled to the integrator output signal and the bandwidth signal, that generates a filter output by scaling the magnitude of the integrator output signal to be independent of the bandwidth.

11. The AGC system of claim 10,
    wherein the AGC filter operates in gain control value update cycles,
    wherein the input signal comprises a series of digital samples,
    wherein the integrator comprises an accumulator that, in response to a symbol rate signal that indicates one of at least two symbol rates that have a factor of two relationship with each other, generates the filter output as a binary signal that is an accumulation of a quantity of the samples occurring during one gain control value update cycle, wherein the ratio of the quantities for any two symbol rates is essentially inversely proportional to the ratio of the two symbol rates; and
    wherein the scalar performs a reduction of the binary output by a factor that is essentially equal to the quantity, by a binary right shift operation.

12. The AGC system of claim 11, wherein the quantity is given by $((2^N)-1)*2^M$, wherein N and M are integers and the binary right shift operation shifts right M+N bits.

13. The AGC system of claim 11, wherein the factor is $2^N * 2^M$.

14. The AGC system of claim 10, wherein the scaler performs an adjustment of the reduced binary output of $((2^N)+1)/(2^N)$.

15. The AGC system of claim 9, wherein the AGC filter generates a binary voltage squared signal that has a high resolution bit width, W, and has a binary value, MAG, that is directly proportional to a recovered signal power of an intercepted signal, and, the AGC system further comprising:
    a received signal strength indicator (RSSI) function that generates an RSSI output that is a high resolution, uncorrected, filtered signal of bit width W, directly from the binary voltage squared signal when the AGC system is in a suspend test mode.

16. The AGC system of claim 15, further comprising:
    a step attenuator coupled to the intercepted signal that attenuates the intercepted signal as determined by an attenuator control signal,
    wherein the RSSI function generates an RSSI output that is a low resolution corrected signal of bit width X that has a value essentially equivalent to the power of an intercepted signal determined by a summation of the relative gain of the LNA, a relative attenuation of the step attenuator, an approximate logarithm to the base of 2 of the MAG, and a constant, and wherein X is an integer less than W.

17. The AGC system of claim 1 further comprising:
    a step attenuator coupled to the gain corrector for receiving the intercepted signal, wherein the intercepted signal is transmitted as part of a signaling protocol that includes a plurality of signal cycles, each of which comprises a preamble portion followed by a normal data portion,
    wherein the gain corrector further generates an attenuator control signal for setting the step attenuator to one of an attenuate state and a pass through state at the commencement of the normal data portion.

18. The AGC system of claim 17, wherein the gain corrector sets the step attenuator to an attenuate state when, during the preamble portion, the step attenuator is attenuated, a gain control value is at a minimum gain control value, and the signal power of a recovered signal is greater than a predetermined AGC threshold.

19. The AGC system of claim 17, wherein the gain corrector sets the step attenuator to a pass-through state during the normal data portion of the intercepted signal when the recovered signal falls below a predetermined step-out threshold.

20. The AGC system of claim 17, wherein when the gain corrector sets the attenuator control signal to the pass-through state during the normal data portion of the transmission signal, the gain corrector does not set the attenuator control signal to the attenuate state again during the normal data portion of the same transmission signal.

* * * * *